Dec. 30, 1958

T. W. COOPER 2,866,929

JUNCTION-TYPE-SEMICONDUCTOR DEVICES
AND METHOD OF MAKING THE SAME

Filed Dec. 1, 1955

THEODORE W. COOPER
INVENTOR

BY Henry Heyman
ATTORNEY 2,866,929

JUNCTION-TYPE-SEMICONDUCTOR DEVICES AND METHOD OF MAKING THE SAME

Theodore W. Cooper, Torrance, Calif., assignor to Hughes Aircraft Company, Culver City, Calif., a corporation of Delaware Application December 1, 1955, Serial No. 550,317

5 Claims. (Cl. 317—235)

Figures 1, 2:
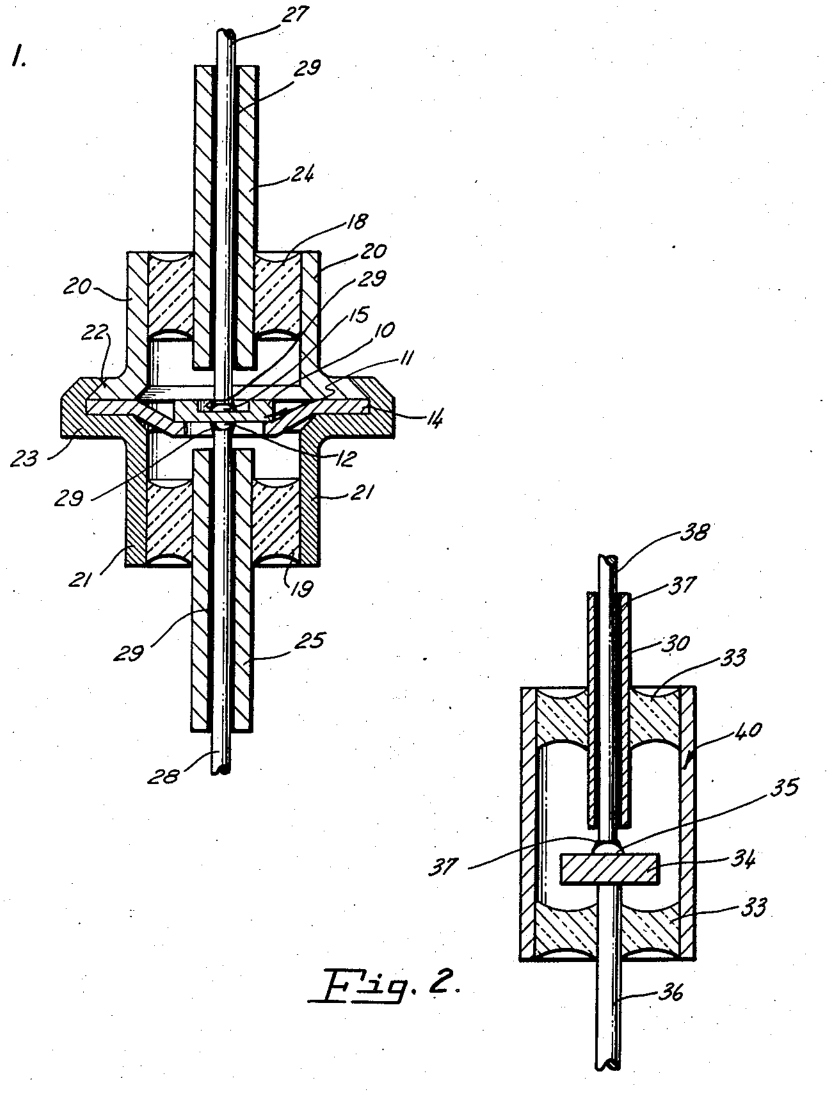

This invention relates to semiconductor signal translating devices and, more particularly, to an improved method for forming an ohmic contact with an area of a junction-type semiconductor crystal in an encapsulated semiconductor device, and to such devices.

Semiconductor materials, such as germanium, silicon, germanium-silicon alloys, indium-antimonide, gallium-antimonide, aluminum-antimonide, indium-arsenide, gallium-arsenide, gallium-phosphorus alloys, and indium-phosphorus alloys, and others, have been found to be extremely useful in electrical translating devices.

Basic to the theory of operation of semiconductor devices is the concept that current may be carried in two distinctly different manners, namely "conduction by electrons" or "excess electron conduction" and "conduction by holes" or "deficit electron conduction." The fact that electrical conductivity by both of these processes may occur simultaneously and separately in a semiconductor specimen affords a basis for explaining the electrical behavior of semiconductor devices. One manner in which the conductivity of a semiconductor specimen may be established is by the addition of "active impurities" into the base semiconductor material.

In the semiconductor art, the term "active impurity" is used to denote those impurities which affect the electrical characteristics of a semiconductor material as distinguished from other impurities which have no appreciable effect upon these characteristics. Generally, active impurities are added intentionally to the semiconductor material for producing single crystals for bodies having predetermined electrical characteristics. Active impurities are classified as either donors—such as antimony, arsenic, bismuth, and phosphorus—or acceptors, such as indium, gallium, thallium, boron, and aluminum. A region of semiconductor material containing an excess of donor impurities and yielding an excess of free electrons is considered to be an impurity doped N-type region. An impurity doped P-type region is one containing an excess of acceptor impurities resulting in a deficit of electrons or, stated differently, an excess of holes.

Semiconductor diodes or transistors utilizing semiconductor crystals of any of the above enumerated materials can be produced with stable electrical characteristics even when a small volume of air is allowed to remain in a package or envelope hermetically sealing the crystal. Point contact semiconductor devices of the type now well known to the art may include a semiconductor crystal and one or more whisker elements in point contact therewith. Among the principal disadvantages of a point contact semiconductor device are their inefficient heat dissipation rate and the relatively low current carrying capacities of the device, both of which are in part caused by the small area of contact between the whisker element and the crystal. It is necessary that point contact devices be operated at relatively low current so as not to exceed their low power dissipation.

When a continuous solid specimen such as a crystal or body of semiconductor material has an N-type region adjacent a P-type region, the boundary between the two regions is termed a P–N or N–P junction. The desirability and advantages of junction, or broad-area, semiconductor devices are apparent and by now well known to those skilled in the art. Among the advantages of semiconductor fused junction devices for some applications are included improvements in such characteristics as lower noise, higher power efficiency, lower operating voltage, greater power handling ability, and similar improvements. Through recent advances in the production of P–N junctions, junction type semiconductor devices have become increasingly important in the art.

A significant problem in the production of junction type semiconductor diodes and transistors has been the formation of a good ohmic connection between the semiconductor crystal body and the contact electrode which extends from the crystal body through the package of an encapsulated device. For example, in the production of a fused junction transistor of the type now well known to the art, the transistor comprises a semiconductor crystal body to which at least three separate ohmic connections are made. Where three connections are used, two are respectively on opposite sides of the semiconductor body, and a third is made to a portion of the body intermediate these sides. More specifically, in an N–P–N junction transistor or a P–N–P junction transistor of the type in which the fused junction is formed by the fusion of a pellet of solvent metal containing an active impurity of the type which determines the conductivity type of the regrown crystal region to the surface of the semiconductor crystal, the two connections are made at substantially opposite points of opposed faces of the parent crystal and a third ohmic connection is made at an edge between these faces. Thus, for example, in an N–P–N junction transistor, in which lead-arsenic pellets are fused to opposed surfaces of a P-type germanium crystal to form opposed N-type regions, a first connection is made at one of the N-type regrown crystal regions by ohmically connecting a contact electrode to the lead-arsenic pellet, a second connection is similarly made at the opposed N-type regrown crystal region, and the third connection is made at the surface of the P-type region which separates the two N-type regrown regions. If a relatively low voltage is applied between one opposed connection and the third connection so that a relatively low impedance is encountered, and a relatively high voltage is applied between the other opposed connection and the third connection so that a relatively high impedance is encountered, the current introduced into a low impedance is extracted from a high impedance and amplification results. The connection at which the current is introduced is known in the art as the "emitter" and the connection at which the current is extracted is known in the art as the "collector." The third connection is known as the "base" or "base electrode."

In the state of the art prior to the present invention, the ohmic connection between the contact electrodes and the collector and emitter regions of the semiconductor crystal body have commonly been formed by utilizing conductors in the form of a ribbon, spring, or whisker which is affixed between the surface of the emitter and collector regions and the electrodes. Such methods of forming the ohmic connection, however, limit the amount of contact which can be obtained between the conductor and the crystal region, resulting in a high thermal resistance at the point of contact between the conductor and the semiconductor crystal surface. Further, in production, difficulties are encountered when the device is assembled because of the various geometrical configurations of the crystal and electrode assemblies.

Accordingly, it is an object of the present invention to provide an improved method of forming ohmic connections to an area of a semiconductor crystal body.

It is another object of the present invention to provide an improved means for forming an ohmic connection between a lead electrode and an area of a semiconductor crystal body which is hermetically encapsulated.

It is a further object of the present invention to provide an improved means for forming an ohmic connection between a lead electrode and an area of an encapsulated semiconductor crystal body which forms an ohmic connection having a relatively large area of contact.

It is still another object of the present invention to provide a means for forming an ohmic connection to a hermetically encapsulated semiconductor device while retaining the hermetic seal within the incapsulating envelope and which lends itself to ease and uniformity of production.

The present invention comprises in combination with an encapsulated fused junction semiconductor device an ohmic connection to an area of the semiconductor crystal body, the ohmic connection comprising a tubular member extending through the encapsulating envelope of the device to a position proximate the area to which the ohmic connection is to be made. A contact electrode is positioned within the tubular member in ohmic contact with the area of the semiconductor body. A quantity of solder is used to ohmically affix the contact electrode to the area and to fill the space between the outer diameter of the contact electrode and the inner surface of the tubular member.

The method of the present invention for obtaining the above described ohmic connection in the production of a junction-type encapsulated device comprises the steps of positioning a hollow tubular member extending through, and electrically insulated from, the encapsulating envelope of the device; positioning a contact electrode within the tubular member; filling the space between the contact electrode and the tubular member with molten solder; and advancing the contact electrode including a quantity of molten solder into ohmic contact with the region of the semiconductor body.

The novel features which are believed to be characteristic of the invention, both as to its organization and method of operation, together with further objects and advantages thereof, will be better understood from the following description considered in connection with the accompanying drawing, in which, two embodiments of the invention are illustrated by way of example. It is to be expressly understood, however, that the drawing is for the purpose of illustration and description only and is not intended as a definition of the limits of the invention.

Fig. 1 is a sectional view of an illustrative fused junction transistor device to which the ohmic connections are made in accordance with the present invention; and Fig. 2 is a cross-sectional view of an illustrative fused junction diode in which the ohmic connection is made in accordance with the present invention.

Referring now to the drawing, Fig. 1 shows a junction transistor of the type known to the art which is illustrative of the semiconductor devices in which the method of the present invention may be advantageously utilized. Fig. 2 similarly shows a junction diode of the type well known to the art in which the method of the present invention has been utilized to obtain the ohmic connection between the lead electrode and the fused junction region of the semiconductor crystal body. For purposes of illustration, an N–P–N junction transistor of the type disclosed and claimed in copending application Serial No. 496,554 for "Semiconductor Transistor Device," by Warren P. Waters and Richard A. Gudmundsen, filed March 24, 1955, and assigned to the assignee of the present application, in which germanium is utilized as the semiconductor body, will be described to show the utility and operation of the present invention. It will be recognized, however, that the method and the operational steps of assembly to be described may also be employed to form ohmic connections to P–N–P or N–P–N junction transistors or junction diodes in which germanium, silicon, or intermetallic semiconductors are used as the semiconductor body.

The present invention relates to an ohmic connecting means in combination with an encapsulated semiconductor device of the type known to the prior art. Referring to Fig. 1, in accordance with the present invention, a first tubular member 24 and a second tubular member 25 are positioned with an open end of the respective tubular member proximate the surface of lead-arsenic pellets 15, 12 which define the opposed N-type regions of an N–P–N semiconductor crystal body 11 to which ohmic connections are to be made. The tubular members 24, 25 extend from the encapsulating envelope so that the second end of the respective tubular members are disposed outside of the envelope. Sintered glass beads 18, 19 are positioned between the tubular members and the inner wall of the encapsulating envelope in such a manner that the tubular members are mechanically affixed to the encapsulating envelope, but electrically insulated therefrom. Although sintered glass beads are used in the illustrative embodiment, other means for electrically insulating the tubular member from the envelope may also be used. A first contact electrode 27 and a second contact electrode 28 having an outside diameter substantially equal to, but less than, the inside diameter of the tubular members are positioned within the respective tubular members 24, 25. The space between the contact electrodes 27, 28 and the respective tubular members is filled with a quantity of solder 29 which mechanically affixes the electrodes and tubular members and furnishes a hermetic seal for the encapsulating means. A quantity of solder 29 also furnishes a large-area ohmic and mechanical connection between the end of the respective contact electrodes 27, 28 and the areas of the semiconductor crystal body 11.

In the presently preferred embodiment of the invention as shown in Fig. 1, the transistor is a fused junction N–P–N transistor having a P-type germanium crystal body 10 with N-type fused junction regions on opposed surfaces thereof. In this illustrative transistor, the semiconductor transistor body is formed by fusing a lead-arsenic alloy emitter pellet 12 to one surface of the P-type germanium square wafer 10 which is of the order of ⅛" on a side and 12 mils in thickness. The emitter pellet 12 is approximately 20 mils in diameter and is fused to the surface of the germanium body 10 by methods well known to the art. The collector pellet 15, which is also a lead-arsenic alloy and is approximately 40 mils in diameter, is similarly fused to the opposed surface of the germanium body 10 to form the collector P–N junction. The P-type base region between the emitter and collector junctions is then approximately 1.5 mils in thickness. It will be noted that the collector junction has a larger area than the emitter junction which is generally desirable.

The semiconductor crystal body is hermetically encapsulated as disclosed in copending application to Waters and Gudmundsen, supra, by affixing the germanium crystal body 11 to a diaphragm 14. The diaphragm 14 is a dish-shaped disc of electrically and thermally conductive material which defines an opening symmetrical about the center line having a diameter substantially less than the width of the transistor body 11 but greater than the diameter of the larger P–N junction of the body. Gold paste, solder, or other thermally conductive material is used to affix the transistor body 11 to the diaphragm 14 such that the center lines of the emitter and collector junctions are substantially coincident with the longitudinal center line of the diaphragm. The encapsulating package for the transistor comprises a first body portion 20 and second body portion 21 which are hollow cylinders of thermally conductive material having open ends and an outwardly directed right angle flange 22, 23 at one end thereof. The flange 22 of the first body portion 20 is substantially equal in diameter to the outside diameter of the diaphragm 14. However, the flange 23 of the second body portion 21 is substantially greater in outside diameter than the flange of the first body portion by an amount sufficient to allow crimping of the second flange 23 over the diaphragm 14 and the first flange 22 as shown. The diaphragm 14 and the first and second body portions 20, 21 are preferably formed of cold rolled steel. It is to be understood, however, that the encapsulating means and the means for positioning and retaining the semiconductor crystal body may be any of the types now known to the art since they form no part of the present invention. The method of mounting the crystal body and the means for encapsulating the semiconductor body described above have, however, given excellent results in combination with the present invention.

In order to form an ohmic connection in accordance with the present invention, the first tubular electrical conductor 24 and the second tubular electrical conductor 25 are positioned proximate the respective emitter and collector areas to which the ohmic connections are to be made by extending the tubular members 24, 25 through the encapsulation means while electrically insulating them therefrom. In this embodiment, the tubular members 24, 25 are formed of iron-nickel alloy and are of the order of 0.06" in outside diameter with an inside diameter of the order of 0.03". For production purposes, it has been found advantageous to affix and seal the tubular members within the body portions by using a sintered glass insulative bond in the form of the glass beads 18, 19 surrounding each tubular member which is formed under high pressure to effect the insulative seal between the tubular member and the inside diameter of the body portion. In the production of a transistor, first and second tubular members 24, 25 are insulatively affixed and sealed within the first and second body portions 20, 21, respectively, and the first and second contact electrodes 27, 28 are inserted into the respective tubular members. The space between the inside surface of the tubular members and the outside surface of the contact electrodes is filled with solder. The first and second body portions 20, 21 are then mated with the diaphragm 14 and the semiconductor crystal body 11 is positioned between the flanges, and the device is assembled and sealed by crimping the flange 23 over the flange 22 and the diaphragm 14. The flanges are mated and joined in such a way that a hermetic seal is obtained between the respective body portions. The contact electrodes 27, 28 are formed of Kovar in this embodiment and have an outside diameter substantially equal to, but less than, the inside diameter of the tubular members and are inserted into the tubular members after being pre-tinned in order to furnish the necessary amount of solder. The assembly of the transistor device is then completed and an ohmic contact is obtained at the collector and emitter junctions, in accordance with the method of the present invention, by electrically heating the contact electrodes 27, 28 and tubular members 24, 25 to a temperature above the melting point of the solder. After the solder becomes molten, the contact electrodes are advanced to the position at which electrical contact is obtained between the contact electrodes and the emitter 12 and collector 15 pellets, respectively. Solder is thus present on the end of each contact electrode and is advanced to the emitter and collector regions. After ohmic connection has been determined electrically, the contact electrodes and the solder carried by the electrodes are further advanced a predetermined amount to provide a relatively large area of contact between the solder and the emitter and collector pellets. The distance through which the contact electrodes are advanced may be determined by routine experiment of one skilled in the art.

Rather than a further advancement of the electrodes after ohmic contact is obtained, the contact electrodes may also be advanced by a predetermined spring pressure to achieve the required area of contact. Since molten solder 29 is also present within the tubular members in sufficient quantity to fill the space between the outside diameter of the contact electrodes 27, 28 and the inside diameter of the tubular members 24, 25, a hermetic seal is obtained when the contact electrodes are allowed to cool. In addition, the tubular member may be mechanically staked to the contact electrode to furnish additional mechanical stability and rigidity.

Thus, the method of the present invention comprises the steps of affixing and sealing a tubular member within the encapsulating means of the semiconductor transistor, filling the inner volume of the tubular member with molten solder, and advancing a contact electrode through the molten solder to effect a large area of contact between the contact electrode and the semiconductor crystal body while maintaining a hermetic seal within the tubular member.

Referring now to Fig. 2, a fused junction diode of the type in which the method of the present invention may be advantageously utilized is shown. As discussed hereinbefore, a tubular member is affixed and sealed within the encapsulating envelope of the diode in such a way that the tubular member extends from a position proximate the area of the semiconductor crystal to which ohmic contact is to be made through a wall of the envelope. The tubular member 30 is again electrically insulated from the encapsulating means, or envelope 40, by means of a sintered glass bead 33. In the diode shown for illustrative purposes, a P-type germanium crystal body 34 having an N-type regrown crystal region formed by the fusion of a lead-arsenic pellet 35 of a surface thereof is used. In the diode shown, an ohmic connection to the P-type crystal body by the electrode 36 is obtained by methods well known to the art during an early stage in the assembly of the device. For example, by affixing the crystal body to the electrode 36 by means of gold paste, solder, or other electrically conducting binders known to the art. In accordance with the present invention, the final seal of the device and the ohmic connection to the lead-arsenic pellet 35 and thus the N-type region are obtained by positioning a contact electrode 38 within the tubular member 30 while filling the space between the tubular member 30 and contact electrode 38 with molten solder 37 and advancing the contact electrode through the molten solder as described hereinbefore to carry a quantity of solder 37 into ohmic contact with the N-type region of the semiconductor crystal body. After ohmic contact is determined electrically, the contact electrode is further advanced a predetermined amount to obtain a relatively large area of contact between the solder and the N-type pellet 35 and thus the N-type region of the crystal. The assembly is then cooled and a hermetic seal is obtained in the tubular member and a large area ohmic contact is obtained with the semiconductor crystal body.

It will be apparent to those skilled in the art that many materials will be suitable as the tubular member and contact electrode of the present invention; however, for optimum results, the material used should prevent undue thermal stresses.

Thus the present invention provides a large-area ohmic contact in an encapsulated semiconductor device while obtaining a final hermetic seal of the device. The present invention lends itself readily to mass production techniques, while allowing uniformity of results with respect to the ohmic contacts necessary in encapsulated semiconductor devices not heretofore possible by methods known to the prior art.

What is claimed is:

1. In an encapsulated P–N junction semiconductor device having a semiconductor crystal body of one conductivity type and a region of semiconductor material of the opposite conductivity type with an envelope hermetically encapsulating said crystal body, the combination comprising: means for forming an ohmic connection with said region of opposite conductivity type, said ohmic connecting means comprising a tubular member extending into and electrically insulated from said encapsulating envelope, said tubular member having an open end proximate a surface of said region of said opposite conductivity type, a glass bead surrounding said tubular member in contact with the inner wall of said envelope such that said tubular member is mechanically affixed within an electrically insulated from said envelope; a contact electrode within said tubular member having an end extending from said open end of said tubular member, said contact electrode being in ohmic contact with said region of opposite conductivity type; a quantity of solder surrounding said contact electrode within said tubular member to mechanically affix and hermetically seal said contact electrode within said tubular member; and a quantity of solder surrounding said contact area of said region of opposite conductivity type and the adjacent portion of said contact electrode.

2. In an encapsulated junction-type transistor having a semiconductor crystal body of one conductivity type and emitter and collector regions of opposite conductivity type at opposed surfaces of said crystal body of one conductivity type, with an envelope hermetically encapsulating said crystal body, the combination comprising: means for forming ohmic connections with said emitter and collector regions, said ohmic connecting means comprising a first and second tubular member extending into and electrically insulated from said encapsulating envelope, said first and second tubular member having an open end proximate said emitter and collector regions, respectively; a first and second contact electrode within said tubular members, respectively, said contact electrodes being in ohmic contact with said emitter and collector regions, respectively; a quantity of solder surrounding said contact electrodes within their associated tubular members to mechanically affix and hermetically seal said contact electrodes within said tubular members, and a quantity of solder surrounding the ohmic contact regions of said emitter and collector regions and the adjacent portions of said contact electrodes.

3. The method of forming an ohmic connection to an area of a semiconductor crystal body in an encapsulated junction-type semiconductor device, said method comprising the steps of: positioning a hollow tubular member extending into said encapsulating envelope to a position proximate the area of said semiconductor body to which the ohmic connection is to be made; electrically insulating said tubular member from said encapsulating envelope; positioning a contact electrode within said tubular member; filling the space between said contact electrode and said tubular member with molten solder; and advancing said contact electrode including a quantity of molten solder into ohmic contact with said area of said semiconductor body.

4. The method of forming an ohmic connection to a region of a semiconductor crystal body in an encapsulated junction-type semiconductor device having a semiconductor crystal body of one conductivity type and a region of the opposite conductivity type, said method comprising the steps of: positioning a hollow tubular member within the envelope of said encapsulated device so that said tubular member extends from a position proximate said region of opposite conductivity type through said envelope to a position disposed outside of said envelope, said tubular member being mechanically affixed to and electrically insulated from said envelope; positioning a contact electrode within said tubular member; filling the space between said contact electrode and said tubular member with molten solder; and advancing the contact electrode including a quantity of molten solder into ohmic contact with said region of opposite conductivity type to form a large area ohmic connection with said region.

5. The method of forming ohmic connections to the collector and emitter regions of an encapsulated junction-type semiconductor transistor in which said semiconductor crystal body comprises a semiconductor crystal of one conductivity type having collector and emitter regions of the opposite conductivity type at opposed surfaces thereof, said method comprising the steps of: positioning first and second tubular members within the envelope of said encapsulated device so that said tubular members extend from a position proximate the collector and emitter regions respectively of said semiconductor transistor body through said envelope to a position disposed outside of said envelope, said tubular members being mechanically affixed to and electrically insulated from said envelope; positioning first and second contact electrodes within said first and second tubular members, respectively; filling the space between said contact electrodes and said tubular members with molten solder; and advancing said contact electrodes including a quantity of molten solder into ohmic contact with said collector and emitter regions, respectively, of said semiconductor transistor body, whereby ohmic and mechanical connections are provided between said contact electrodes and said collector and emitter regions and said contact electrodes are hermetically sealed within said tubular members.

References Cited in the file of this patent

UNITED STATES PATENTS

| | | |
|---|---|---|
| 2,697,805 | Collins | Dec. 21, 1954 |
| 2,723,370 | Bradshaw et al. | Nov. 8, 1955 |
| 2,736,847 | Barnes | Feb. 28, 1956 |
| 2,750,543 | Wadsworth | June 12, 1956 |
| 2,805,369 | Wieringen | Sept. 3, 1957 |
| 2,820,931 | Koury | Jan. 21, 1958 |